US008674450B1

United States Patent
Deng et al.

(10) Patent No.: US 8,674,450 B1
(45) Date of Patent: Mar. 18, 2014

(54) SEMICONDUCTOR STRUCTURES AND FABRICATION METHOD

(71) Applicant: Semiconductor Manufacturing International Corp., Shanghai (CN)

(72) Inventors: Hao Deng, Shanghai (CN); Bin Zhang, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/733,461

(22) Filed: Jan. 3, 2013

(30) Foreign Application Priority Data

Aug. 29, 2012 (CN) .......................... 2012 1 0312974

(51) Int. Cl.
*H01L 21/70* (2006.01)
*H01L 21/8238* (2006.01)

(52) U.S. Cl.
USPC .......................................... 257/368; 438/199

(58) Field of Classification Search
USPC .......................................... 257/368; 438/198
See application file for complete search history.

(56) References Cited

U.S. PATENT DOCUMENTS

| 7,446,026 B2 * | 11/2008 | Zhang et al. ................... 438/592 |
| 2007/0085150 A1 * | 4/2007 | Yaegashi ........................ 257/390 |
| 2007/0238236 A1 * | 10/2007 | Cook et al. .................... 438/197 |
| 2008/0135878 A1 * | 6/2008 | Kim et al. ..................... 257/192 |
| 2012/0097977 A1 * | 4/2012 | Yamaguchi ..................... 257/77 |
| 2013/0149830 A1 * | 6/2013 | Rhee et al. .................... 438/303 |

\* cited by examiner

*Primary Examiner* — Matthew Landau
*Assistant Examiner* — Igwe U Anya
(74) *Attorney, Agent, or Firm* — Anova Law Group, PLLC

(57) ABSTRACT

A method is provided for fabricating a semiconductor structure. The method includes providing a semiconductor substrate, and forming a shallow trench isolation structure in the semiconductor substrate. The method also includes forming a plurality of parallel gate structures on the semiconductor substrate surrounded by the shallow trench isolation structure. Further, the method includes forming a plurality of first trenches in the semiconductor substrate at least one side of the gate structures proximity to the shallow trench isolation structure, and forming a first silicon germanium layer with a first germanium concentration in each of the first trenches. Further the method also includes forming a plurality second trenches in semiconductor substrate at least one side of the gate structures farther from the shallow trench isolation structure, and forming a second silicon germanium layer with a second germanium concentration greater than the first germanium concentration in each of the second trenches.

19 Claims, 5 Drawing Sheets

US 8,674,450 B1

SEMICONDUCTOR STRUCTURES AND FABRICATION METHOD

CROSS-REFERENCES TO RELATED APPLICATIONS

This application claims the priority of Chinese patent application No. 201210312974.4, filed on Aug. 29, 2012, the entirety of which is incorporated herein by reference.

FIELD OF THE INVENTION

The present invention generally relates to the field of semiconductor manufacturing technology, and more particularly, relates to semiconductor structures having shallow trench isolation structures and MOS transistors, and techniques for fabricating high-performance semiconductor devices and MOS transistors.

BACKGROUND

In the field of semiconductor manufacturing, with the development of the integration and miniaturization of semiconductor devices, the size of shallow trench isolation structures (STI) used to electrically isolate adjacent semiconductor devices correspondingly becomes smaller. However, the STI structure is often made of silicon oxide which is different from the material of a semiconductor substrate, when the STI structure is used to isolate the adjacent semiconductor devices, a stress effect can be induced to the surrounding semiconductor substrate, and affect the electrical properties of a MOS transistor.

FIG. 1 shows a cross-section view of an existing MOS transistor with an STI structure. As shown in FIG. 1, the existing MOS transistor with an STI structure includes: a semiconductor substrate 10, an active region 11 in the semiconductor substrate 10, a gate structure 12 on the active region 11, a drain region 13 and a source region 14 at both sides of the gate structure 12, a channel region 15 underneath the gate structure 12 and an STI structure 18 in the semiconductor substrate 10 and around the MOS transistor. The STI structure 18 isolates adjacent MOS transistors. Because the STI structure 18 is formed by a high temperature chemical vapor deposition process (CVD), the temperature of forming silicon dioxide in the shallow trench is very high. When the silicon dioxide is cooled down from a deposition temperature to the room temperature after the CVD process, both silicon dioxide and the silicon semiconductor substrate may shrink. Because the thermal expansion coefficients of silicon and silicon dioxide are different, the shrink amount of silicon and silicon dioxide would be different. Correspondingly, STI structure will generate a considerable stress to channel region 15, which is highly dependent on the STI formation process.

FIG. 2 shows existing multiple MOS transistors with an STI structure 28, in which seven PMOS transistors are surrounded by the STI structure 28. Source region and drain region 24 of a PMOS transistor are made of silicon germanium. Thus, a channel region 25 would have a compressive stress caused by lattice mismatch between silicon and silicon germanium. FIG. 3 is a lateral stress distribution of the multiple channel regions 25, source/drain regions 24 of the seven PMOS transistors surrounded by the STI structure 28 shown in FIG. 2. It may be shown that the seven channel regions 25 undergo compressive stress, and the compressive stress of the channel regions of the PMOS transistors proximity to the STI structure 28 is 24%~35% smaller than the compressive stress of the channel regions of the PMOS transistors far from the STI structure 28 due to STI stress impact. It may cause additional electrical property variation of MOS to MOS transistors.

Further, with the shrinking of the size of semiconductor devices, the Aspect Ratio (AR) of the STI structure is increasing. In order to make silicon dioxide to completely fill the shallow trench without voids, utilizing a High Aspect Ratio Process (HARP) to form STI structures becomes more and more common. However, the STI structure further generates tensile stress to the surrounding semiconductor substrate when the—High Aspect Ratio process (HARP) is used to form the STI structure.

Currently, the impact of tensile stress of the STI structure may be alleviated by creating dummy gate close to STI structures or optimizing the integration process and scheme of the STI modules, but these approaches often need extra steps and introduce side-effects. Thus, it may make the fabrication process become more complex, and increase the production cost at the same time. The disclosed methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate, and forming a shallow trench isolation structure in the semiconductor substrate. The method also includes forming a plurality of parallel gate structures on the semiconductor substrate surrounded by the shallow trench isolation structure. Further, the method includes forming a plurality of first trenches in the semiconductor substrate at least one side of the gate structures proximity to the shallow trench isolation structure, and forming a first silicon germanium layer with a first germanium concentration in each of the first trenches. Further the method also includes forming a plurality second trenches in semiconductor substrate at least one side of the gate structures farther from the shallow trench isolation structure, and forming a second silicon germanium layer with a second concentration greater than the first concentration in each of the second trenches.

Another aspect of the present disclosure includes a semiconductor structure. The semiconductor structure includes a semiconductor substrate having a surrounding STI structure, and a plurality of parallel gate structures on the semiconductor substrate surrounded by the STI structure. The semiconductor structure also includes a plurality of first silicon germanium layers proximity to the STI structure and a plurality of second silicon germanium layers far from the STI structure. Each gate structure and the first silicon germanium layers and/or the second silicon germanium layers at both sides of the gate structure forms a PMOS transistor. The germanium concentration of first germanium layers and second germanium layers is different.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

An existing fabrication process of shallow trench isolation structures (STI) may generate tensile stress to active region. When an STI structure surrounds a plurality of MOS transistors. The channel regions of the MOS transistors proximity to the STI structure are impacted more from STI stress due to proximity effect than the channel regions of the MOS transistors far from the STI structure. The stress difference of the channel regions at different locations may show different electrical properties. Therefore, MOS transistors with a same shape, size and same fabrication process at different positions may have different carrier mobility, and thus the MOS transistors at different positions may have different electrical properties which can affect the properties of an integrated circuit.

Specifically, when the MOS transistors surrounded by the STI structure are all PMOS transistors, because the carriers of the channel regions of a PMOS transistor are holes, a compressive stress of the channel region may increase the carrier mobility of the PMOS transistor, and a tensile stress of the channel region may decrease the carrier mobility of the PMOS transistor. The STI structure generates a tensile stress to the surrounding active region, and the impact from STI tensile stress to the channel regions of MOS transistors proximity to the STI structure are more than the channel regions of MOS transistors far from the STI structure, thus the carrier mobility of the PMOS transistors proximity to the STI structure may be lower than the carrier mobility of the PMOS transistors far from the STI structure, and may worsen the electric properties of the PMOS transistors proximity to the STI structure.

Figure 9:
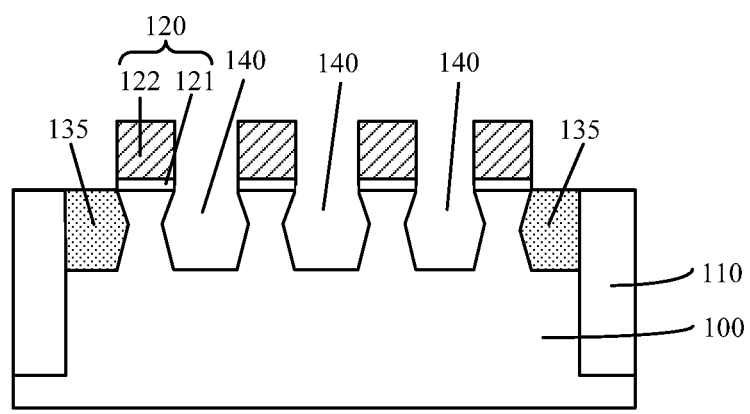
Figure 10:
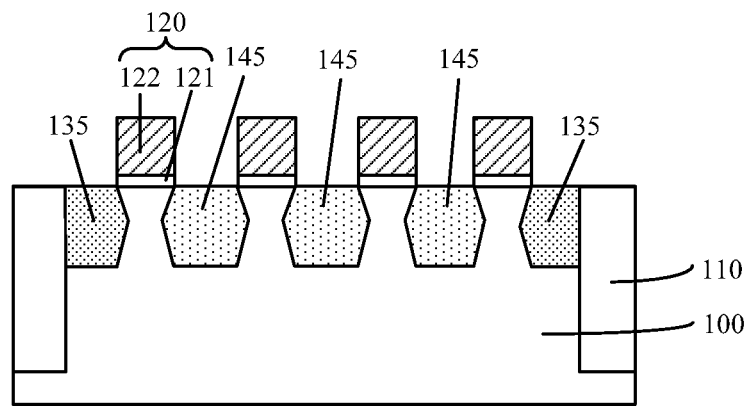
Figure 11:
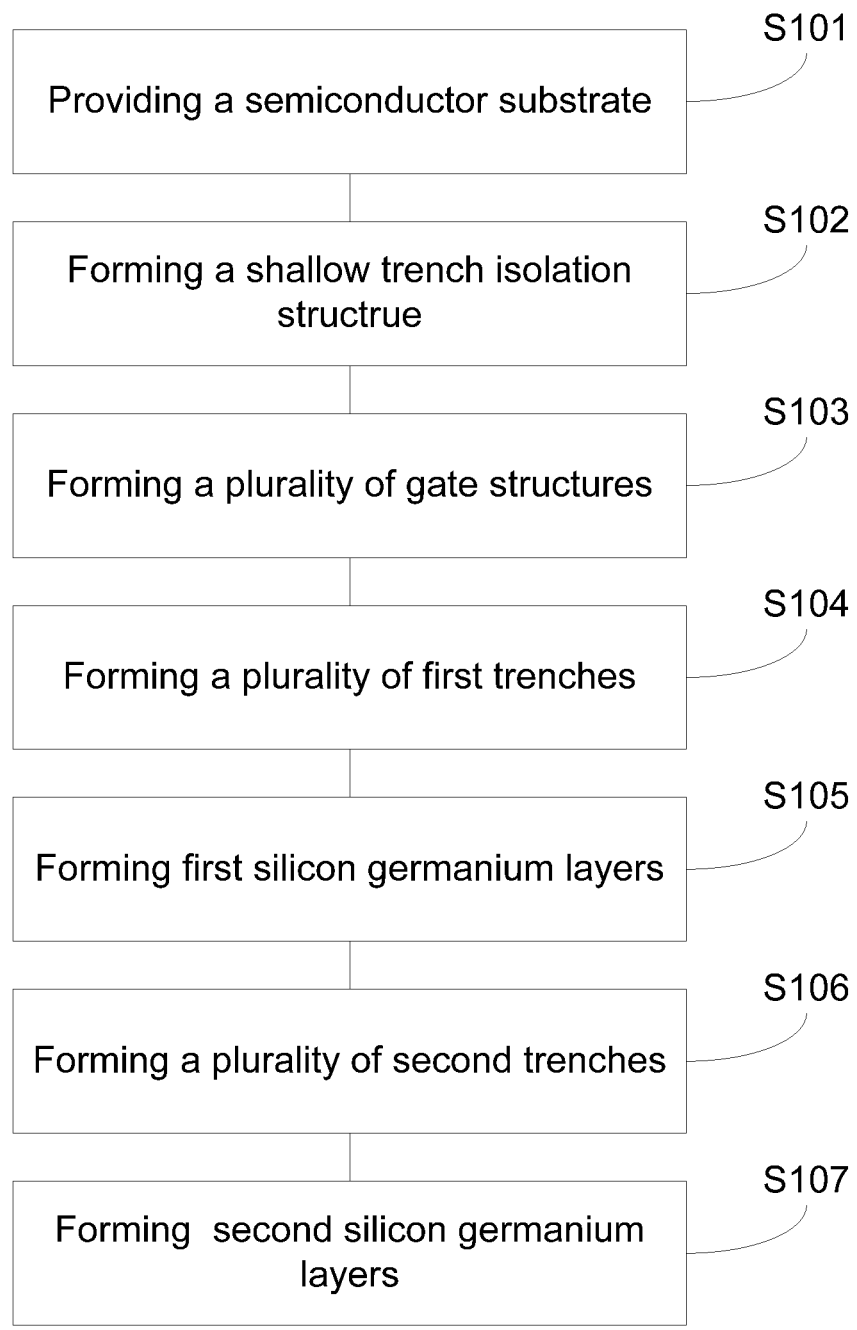
FIG. 11 illustrates an exemplary fabrication process of a plurality of MOS transistors surrounded by an STI structure consistent with the disclosed embodiments.

An improved semiconductor structure and a fabrication process may be used to alleviate STI tensile stress impact and improve electric properties variation between PMOS transistors proximity to the STI structure and PMOS transistors far from the STI structure. FIG. 11 illustrates an exemplary fabrication process of a plurality of MOS transistors surrounded by an STI structure consistent with the disclosed embodiments. FIGS. 4-10 illustrate exemplary semiconductor structures corresponding to certain stages of the exemplary fabrication process.

Figure 1:
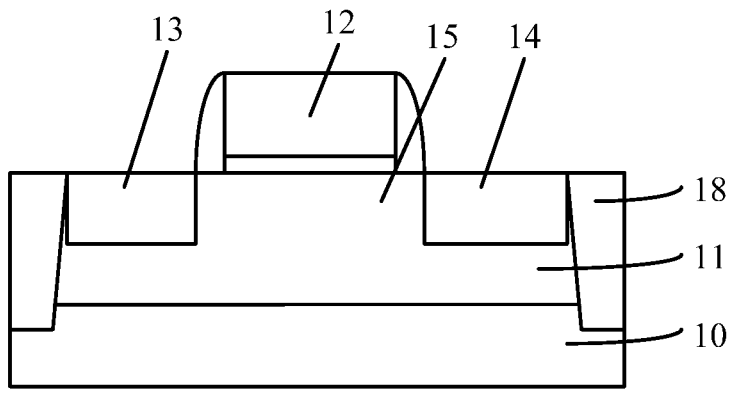
FIG. 1 illustrates the structure of an existing MOS transistor surrounded by an STI structure.
Figure 2:
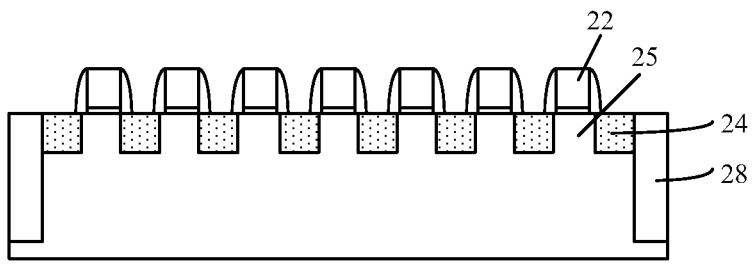
FIG. 2 illustrates an existing semiconductor structure having a plurality of MOS transistors surrounded by an STI structure.
Figure 3:
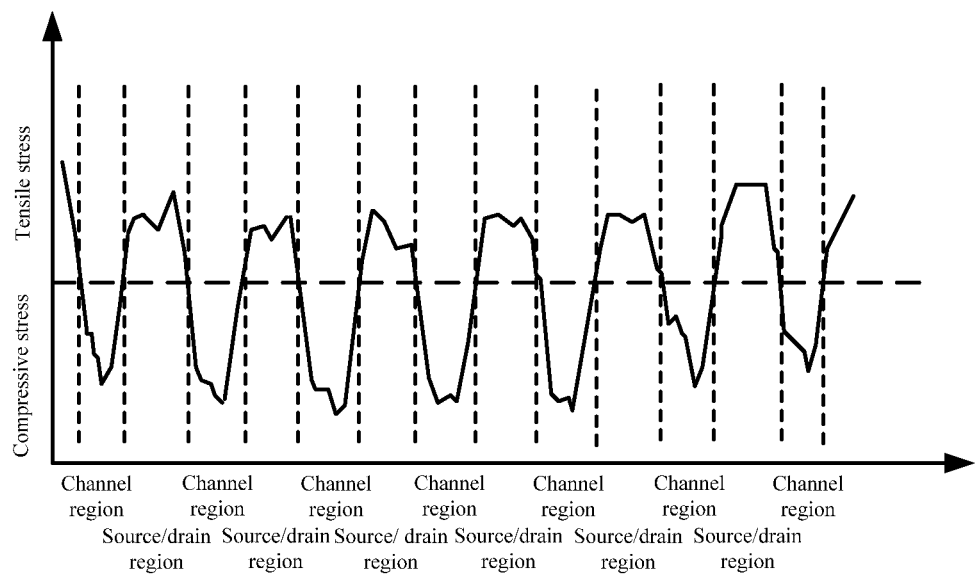
FIG. 3 illustrates a lateral stress distribution graph of a plurality of channel regions and source/drain regions of an existing semiconductor structure.
Figure 4:
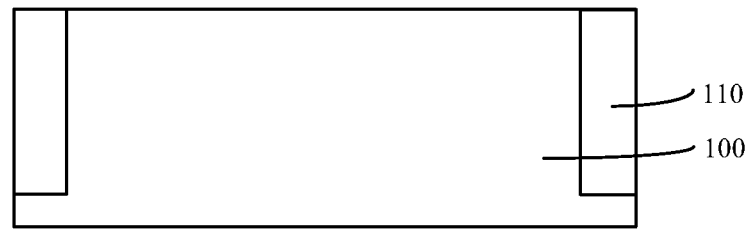
FIGS. 4-10 illustrate exemplary semiconductor structures corresponding to certain stages of an exemplary fabrication process of a plurality of MOS transistors surrounded by an STI structure consistent with the disclosed embodiments.

As shown in FIG. 11, at the beginning of the fabrication process, a semiconductor substrate is provided (S101). FIG. 4 shows a corresponding semiconductor structure.

As shown in FIG. 4, a semiconductor 100 is provided. The semiconductor substrate 100 may include any appropriate type of semiconductor material, such as single crystal silicon, poly silicon, amorphous silicon, silicon germanium, carborundum, indium antimonide, lead telluride, indium arsenide, indium phosphide, gallium arsenide, gallium antimonide, alloy semiconductor, or silicon on insulator (SOI). In one embodiment, the semiconductor substrate 100 is N-type doped silicon. The semiconductor substrate 100 may also provide a base for subsequent processes and structures.

Returning to FIG. 11, after the semiconductor 100 is provided, a shallow trench isolation structure may be formed in the semiconductor substrate 100 (S102). The corresponding semiconductor is shown in FIG. 4.

As shown in FIG. 4, a shallow trench isolation structure (STI) 110 may be formed in one surface of the semiconductor substrate 100. The STI structure 110 may be made of any appropriate material, such as silicon nitride, silicon oxide, siliconoxynitride, siliconoxycarbide, amorphous carbon, or carbonsiliconoxynitride, etc. In one embodiment, the STI structure 110 is made of silicon oxide.

In certain embodiments, the fabrication process of the STI structure 110 may sequentially include: forming a pad oxide layer on the surface of the semiconductor substrate 100 (not shown); forming a silicon nitride layer on the pad oxide layer (not shown); forming a first photo resist layer on the silicon nitride layer (not shown), and exposing the photo resist layer to form a patterned first photo resist layer (not shown); etching a portion the silicon nitride layer, the pad oxide layer and the semiconductor substrate 100 exposed by the patterned first pattern layer to form a shallow trench; forming a silicon oxide layer in the shallow trench and the surface of the silicon nitride layer to completely fill the shallow trench after removing the first patterned photo resist layer; and forming the STI structure 110 in the shallow trench by a chemical mechanical polishing (CMP) process to polish the silicon oxide layer using the silicon nitride layer as a polishing barrier layer, i.e., the CMP process stops at silicon nitride layer. After forming the STI structure 110, silicon nitride layer may be removed, and a thermal annealing process may then be performed. The silicon nitride layer may be removed by any appropriate process, such as a dry etching process, or a wet etching process.

With the continuous shrinkage of semiconductor device, the width of the STI structure 110 of the semiconductor device correspondingly becomes smaller. In order to retain the isolation function of the STI structure 110, the STI structure 110 may have to have a certain depth, which may cause the Aspect Ratio (AR) of the STI structure 110 to become greater and greater. In certain embodiments, the Aspect Ratio (AR) may be up to 10:1. Therefore, conventional processes using a chemical vapor deposition process may be unable to effectively fill up the shallow trench.

In one embodiment, a high aspect ratio process (HARP) is used to form the STI structure 110. Specifically, the HARP process uses a sub-atmospheric chemical vapor deposition (SACVD) process to form oxide material in the shallow trench and on the silicon nitride layer. The precursors of the SACVD process may be $O_3$/TEOS (tetra-ethyl-ortho-silicate). The deposition temperature may be approximately 540° C. The Aspect Ratio (AR) of the shallow trench may be greater than 8:1. However, the STI structure 110 formed by the HARP may generate tensile stress to the surrounding active region, and may further increase the tensile stress of the active region proximity to the STI structure 110. Various other methods may also be used to form the oxide material, such as a high density plasma chemical vapor deposition (HDPCVD) process, or a flowable chemical vapor deposition (FCVD) process, etc.

In certain other embodiments, an active region may be formed in the semiconductor substrate 100 surrounded by the STI structure 110. The doping type of the active region may be corresponding to the type of the later-formed MOS transistors. In one embodiment, when the later-formed MOS transistor is a PMOS transistor, the doping ion of the active region is an N-type doping ion, and the STI structure 110 may isolate adjacent active regions.

Figure 5:
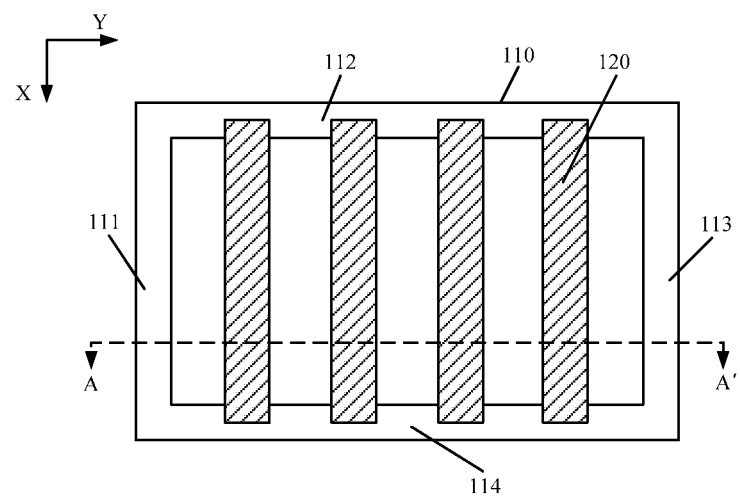

Returning to FIG. 11, after forming the STI structure 110, a plurality of parallel gate structures may formed on the semiconductor substrate 100 surrounded by the STI structure 110 (S103). FIG. 5 shows a top view of a corresponding semiconductor structure, and FIG. 6 shows a cross-section view of the corresponding semiconductor structure along the AA' direction marked in FIG. 5.

Figure 6:
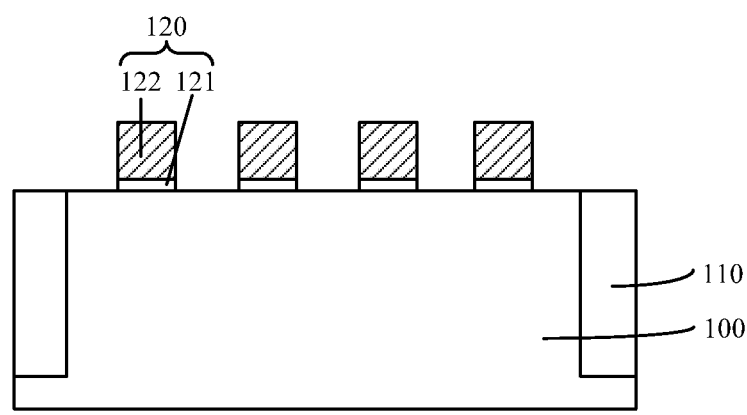

As shown in FIGS. 5-6, a plurality of parallel gate structures 120 are formed on the silicon substrate 100 surrounded by the STI structure 110. Referring to FIG. 6, an individual gate structure 120 may have a gate dielectric layer 121 on the semiconductor substrate 110, a gate electrode 122 on the gate dielectric layer 121, and sidewalls covering the side surfaces of the gate dielectric layer 121 and the gate electrode 122 (not shown). The gate dielectric layer 121 may be made of any appropriate material, such as silicon oxide, siliconoxynitride, or high-K dielectric material, etc. The gate electrode may be made of any appropriate material, such as poly silicon, or metal material, etc. The sidewalls may be made of any appropriate material, such as silicon oxide, silicon nitride, and/or a stacked layer consisting both silicon oxide and silicon nitride.

Referring to FIG. 5, the STI structure 110 surrounds the substrate 100 as a rectangle, a side 111 and a side 113 of the rectangle are along the X direction, and a side 112 and a side 114 of the rectangle are along the Y direction. Because the stress generated by the STI structure 110 is perpendicular to the STI structure 110, the tensile stress generated by the side 111 and the side 113 of the STI structure 110 is perpendicular to the gate structures 120, the carrier mobility of the channel regions underneath the gate structures 120 may be affected. Furthermore, the impact of carrier mobility between PMOS transistors proximity to the STI structure and PMOS transistors far from the STI structure are different. The direction of the tensile stress generated by the side 112 and the side 114 of the STI structure 110 is parallel to the STI structure 110, the carrier mobility of the channel region underneath the gate structure 120 may also be affected, however the impact of carrier mobility between PMOS transistors proximity to the STI structure and PMOS transistors far from the STI structure are same. Therefore, in one embodiment, the term "the structures proximity to the STI structure 110" may refer to the structures proximity to the side 111 and the side 113 of the STI structure 110. The structures proximity to the STI structure 110 may include the gate structures 120, later formed silicon germanium layer, and/or a portion of the semiconductor substrate 100.

Figure 7:
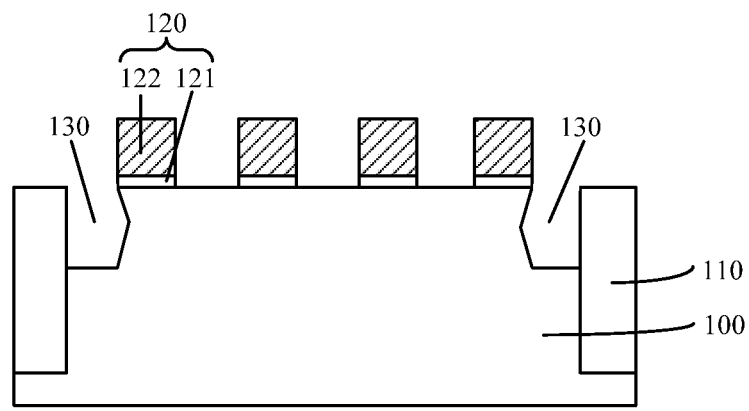

Returning to FIG. 11, after forming the gate structure 120, a plurality of first trenches may be formed in the semiconductor substrate 100 (S104). FIG. 7 shows a corresponding semiconductor structure.

As shown in FIG. 7, a plurality of first trenches 130 is formed in the semiconductor substrate 100. In one embodiment the number of the first trenches 130 may be two. The two trenches 130 are formed at one side of the two gate structures 120 most proximity to the STI structure 110. That is the two first trenches 130 are formed at the sides of the two gate structures 120 most proximity to the side 111 and the side 113 of the STI structure 110.

The two first trenches 130 may be formed sequentially by: forming a first hard mask layer, i.e. a material used as an etch mask in lieu of polymer or other organic "soft" photo resist materials, on the surface of the semiconductor substrate 100, the surface of the STI structure 110, and the sidewalls and surfaces of the gate structures 120 (not shown); forming a patterned second photo resist layer having a pattern of first openings corresponding to the two first trenches 130 on the hard mask layer (not shown); forming the first openings inside the first hard mask layer using the patterned second photo resist layer as a mask, and a portion of the semiconductor substrate 100 at the sides of the two gate structures 120 most proximity to the STI structure 110 may be exposed; and etching the exposed semiconductor substrate 100 using the first hard mask layer having the first openings as a mask to form the two first trenches 130. The first hard mask layer may be made of one or more of silicon oxide, silicon nitride and siliconoxynitride, etc.

Various processes may be used to etch the semiconductor substrate 100 to form the two first trenches 130, such as a dry etching process or a wet etching process, or a combination thereof. In one embodiment, the etching process of the two first trenches 130 is a combination of the dry etching process and the wet etching process. Specifically, two trenches with rectangular cross-sections are formed by a dry etching process, followed by wet etching the two trenches with rectangular cross-sections using a tetramethylammonium hydroxide (TMAH) solution process, and forming the two first trenches 130 with "Σ" shaped cross-sections. The first silicon germanium layer later formed inside the "Σ" shaped first trenches 130 may generate a relatively large compressive stress in channel regions. In certain other embodiments, the first trenches 130 may be formed by only the dry etching process. The dry etching process may include a plasma etching process such as a reactive ion etching process (RIE) or an ion beam etching process. Various appropriate solutions may be used in the wet etching process.

Figure 8:
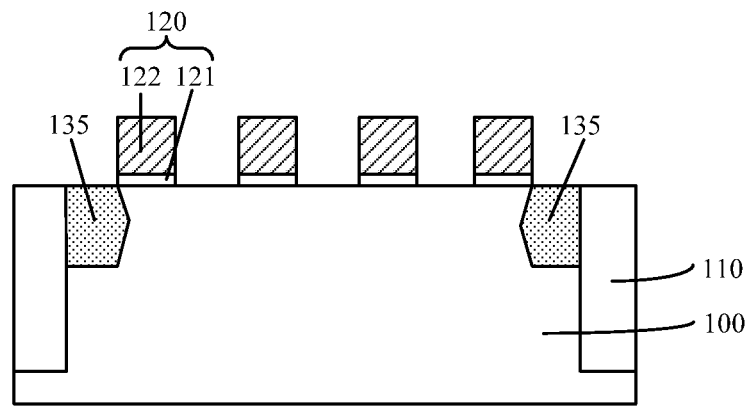

Returning to FIG. 11, after forming the two first trenches 130, a first silicon germanium layer may be formed in each of the trenches 130 (S105). FIG. 8 shows a corresponding semiconductor structure.

As shown in FIG. 8, a first silicon germanium layer 135 is formed in each of the two first trenches 130. The first silicon germanium layer 135 may be formed by any appropriate process such as a chemical vapor deposition process (CVD), a physical vapor deposition process (PVD), a flowable chemical vapor deposition process (FCVD), or a selective epitaxy growth process (SEG). In one embodiment, the first silicon germanium layer 135 is formed by an SEG process. Silicon source, germanium source, other reaction gas and carrier gas are introduced into the reaction chamber, the first silicon germanium layer 135 may eptaxially grow in the two first trenches 130. The pressure of the reaction chamber may be in a range of approximately 0.1 Torr~200 Torr. The temperature of the reaction chamber may be in a range of approximately 700° C.~900° C. The silicon source may include silane, disilane, trisilane, organosilane, or a combination thereof. The germanium source may include germane, digermane, trigermane, organogermane, or a combination thereof. The other reaction gas may include hydrogen chloride, hydrogen fluoride, chlorine, silicon tetrachloride, or a combination thereof. The carrier gas may include hydrogen, nitrogen, helium, argon, or a combination thereof. Due to the selective process property, the final silicon germanium material only epitaxially form in the two first trenches 130, thus the first silicon germanium layer 135 is formed in each of the two first trenches 130.

The molar percentage of germanium of the final first silicon germanium layer 135 (so called first germanium concentration) may be adjusted by varying the ratio of the silicon source and the germanium source. In one embodiment, the molar percentage of germanium of the first silicon germanium layer 135 is in a range of approximately 30%~45%.

Certain other molar percentages of germanium of the first silicon germanium layer 135 may also be used in other embodiments.

After forming the first silicon germanium layer 135, the first hard mask layer may be removed. The first hard mask layer may be removed by any appropriate process, such as a dry etching process including a plasma etching process or a ion beam etching process, or a wet etching process. In one embodiment, the first hard mask layer is made of silicon oxide, and the silicon oxide hard mask layer may be removed by a wet etching process. An etching liquid of the wet etching process may be a diluted hydrogen fluoride. The ratio of water and hydrogen fluoride of the diluted hydrogen fluoride may be in a range of approximately 100:1~300:1. Other type and/or concentration of etching liquid may also be used to remove the first hard mask layer.

In certain other embodiments, the first hard mask layer may be kept, and a later-formed second hard mask layer may be formed on the first hard mask layer and the surface of the first silicon germanium layer 135. Later-formed second trenches may be formed using the second hard mask as an etching mask.

Returning to FIG. 11, after forming the first silicon germanium layer 135, a plurality of second trenches may be formed in the semiconductor substrate 100 at both sides of the gate structures 120 farther from the STI structures 110 (S106). FIG. 9 shows a corresponding semiconductor structure.

As shown in FIG. 9, a plurality of second trenches 140 are formed in the semiconductor substrate 100 at both sides of the gate structures 120 farther from the STI structure 110. The term "the gate structures 120 farther from the STI structure 110" may refer to rest of the gate structures 120 excluding the two outmost gate structures 120 shown in FIG. 9.

In one embodiment, the fabrication process of the second trenches 140 may sequentially include: forming a second hard mask layer on the surface of the semiconductor substrate 100, the sidewalls and surfaces of the gate structures 120, and the surfaces of the first silicon germanium layer 135 (not shown); forming a patterned third photo resist layer having patterns of the second openings corresponding to the second trenches on the second hard mask layer; forming a plurality second openings inside the second hard mask layer to expose a portion of the semiconductor substrate 100 at both sides of the gate structures 120 farther from the STI structure 110; etching the exposed semiconductor substrate 110 to form the second trenches 140 using the second hard mask layer having the second openings as an etching mask. The second hard mask may be made of one or more of silicon oxide, silicon nitride, and siliconoxynitride, etc.

Various processes may be used to etch the semiconductor substrate 100 to form the second trenches 140, such as a dry etching process or a wet etching process, or a combination thereof. In one embodiment, the etching process of the second trenches 140 is a combination of the dry etching process and the wet etching process. Specifically, trenches with rectangular cross-sections are formed by the dry etching process, followed by wet etching the trenches with the rectangular cross-sections using a tetramethylammonium hydroxide (TMAH) solution process to form the second trenches 140 with "Σ" shaped cross-sections. Later formed second silicon germanium layer formed inside the "Σ" shaped second trenches 140 may generate a relatively large tensile stress in channel regions of PMOS transistors. In certain other embodiments, the second trenches 140 may be formed by only the dry etching process. The dry etching process may include a plasma etching process such as a RIE process or an ion beam etching process. Various appropriate solutions may be used in the wet etching process.

Returning to FIG. 11, after forming the second trenches 140, a second silicon germanium layer may be formed in each of the second trenches 140 (S107). FIG. 10 shows a corresponding semiconductor structure.

As shown in FIG. 10, a second silicon germanium layer 145 is formed in each of the second trenches 140. The portion of the semiconductor substrate 100 at both sides of each of gate structures 120 has the first silicon germanium layer 135 and/or the second silicon germanium layer 145 inside. The second silicon germanium layer 145 may be formed by any appropriate process such as a chemical vapor deposition (CVD) process, a physical vapor deposition (PVD) process, a flowable chemical vapor deposition (FCVD) process, or a selective epitaxial growth process (SEG).

In one embodiment, the second silicon germanium layer 145 is formed by an SEG process similar to the fabrication process of the first silicon germanium layer 135. Silicon source, germanium source, other reaction gas and carrier gas are introduced into the reaction chamber, the first silicon germanium layer 145 may eptaxially grow in the second trenches 140. A pressure of the reaction chamber may be in a range of approximately 0.1 Torr~200 Torr. A temperature of the reaction chamber may be in a range of approximately 700° C.~900° C. The silicon source may include silane, disilane, trisilane, organosilane, or a combination thereof. The germanium source may include germane, digermane, trigermane, organogermane, or a combination thereof. The other reaction gas may include hydrogen chloride, hydrogen fluoride, chlorine, silicon tetrachloride, or a combination thereof. The carrier gas may include hydrogen, nitrogen, helium, argon, or a combination thereof. Due to selective process property, the final second silicon germanium material only epitaxially form in the second trenches 140, thus the second silicon germanium layer 145 is formed in each of the second trenches 140.

The molar percentage of germanium of the second silicon germanium layer 145 (so called second germanium concentration) may be adjusted by varying the ratio of the silicon source and the germanium source introduced into the reaction chamber. In one embodiment, the molar percentage of germanium of the second silicon germanium layer 145 may be in a range of approximately 20%~35%, and the molar percentage of the germanium of the first silicon germanium layer 135 may be in a range of approximately 30%~45%. Thus the molar percentage of the germanium of the first silicon germanium layer 135 may be approximately 5%~10% greater than the molar percentage of germanium of the second silicon germanium layer 145. The difference between the molar percentage of germanium of the first silicon germanium layer 135 and the molar percentage of germanium of the second silicon germanium layer 145 may have different values in other embodiments.

Because the molar percentage of germanium of the first silicon germanium layer 135 proximity to the STI structure 110 may be greater than the molar percentage of germanium of the second silicon germanium layer 145 farther from the STI structure 110, the compressive stress generated by the first silicon germanium layer 135 proximity to the STI structure 110 may be greater than the compressive stress generated by the second silicon germanium layer 145 farther from the STI structure 110, and the tensile stress generated by the STI structure 110 may gradually decrease from a position proximity to the STI structure 110 to a position farther from the STI structure 110, thus the effective stress of the channel regions proximity to the STI structure 110 may be equivalent to the effective stress of the channel regions far from the STI structure 110. Therefore, the carrier mobility of the PMOS transistors surrounded by the STI structure 110 may be identical, and the electrical properties of the PMOS transistors proximity to the STI structure 110 may be desired.

In another embodiment, a difference of the molar percentages of the first silicon germanium layer 135 and the second germanium layer 145 may be created by doping the first silicon germanium layer 135 using a germanium ion implantation process. A higher germanium concentration in the first silicon germanium layer 135 may be obtained after the germanium ion implantation process. Therefore, it may be unnecessary to form the first silicon germanium layer 135 and the second silicon germanium layer 145 separately. The fabrication process may be simplified.

In one embodiment, the first silicon germanium layer 135 may be formed in the semiconductor substrate 100 at one side of one gate structure 120 most proximity to the STI structure 110, and the second silicon germanium layer 145 may be formed in the semiconductor substrate 100 at both sides of the gate structures 120 farther from the STI structure 110. In another embodiment, the first silicon germanium layer 135 may be formed in the semiconductor substrate 100 at one side or both sides of one or two gate structures 120 most proximity to the STI structure 110. That is, two first silicon germanium layers 135 may be formed in the semiconductor substrate 100 at both sides of the gate structure 120 most proximity to the STI structure 110. In another embodiment three first silicon germanium layers 135 may be formed in the semiconductor substrate 100 at the both sides of the gate structure 120 most proximity to the STI structure 110 and one side of the gate structure 120 next to the gate structure 120 most proximity to the STI structure 110. In another embodiment, four first silicon germanium layers 135 may be formed in the semiconductor 100 at the both sides of the gate structure most proximity to the STI structure 110 and both sides of the gate structure 120 next to the gate structure 120 most proximity to the STI structure 110, and the second silicon germanium layers 145 may be formed in semiconductor substrate 100 at one and/or both sides of each of the rest of the gate structures 120. Because the STI structure 110 may generate a tensile stress, and the tensile stress may gradually decrease from the position proximity to the STI structure 110 to the position farther from the STI structure 110, the effective stress of the channel regions proximity to the STI structure 100 may be adjusted to be equivalent to the effective stress of the channel regions far from the STI structure 110 by adjusting the molar percentage of germanium of one and/or a plurality of silicon germanium layers proximity to the STI structure 110 to be greater than the molar percentage of germanium of the rest of the silicon germanium layers.

When the number of the first trenches/first silicon germanium layers 135 proximity to the STI structure 110 is greater than 2, the molar percentages of germanium of the different first silicon germanium layers 135 may be same, or may be different. When the molar percentages of germanium of the different first silicon germanium layers 135 are different, the molar percentage of germanium of the first silicon germanium layer 135 proximity to the STI structure 110 may be relative high, and the molar percentage of germanium of the first germanium layer 135 farther from the STI structure 110 may be relatively low. But the molar percentage of germanium of any of the first silicon germanium layers 135 may be still greater than the molar percentage of germanium of the second silicon germanium layer 145, thus a compressive stress gradient may be formed in different channel regions. The gradually-changed compressive stress may compensate the gradually changed tensile stress generated by the STI structure 110, thus the effective stress of the channel regions may be effectively controlled, and the effective stress of the channel regions proximity to the STI structure 110 may be equivalent to the effective stress of the channel regions farther from the STI structure 110.

When the molar percentages of the different first silicon germanium layers 135 are different, the different first silicon germanium layers 135 with different molar percentages may be formed by multiple times, with a single first silicon germanium layer 135 being formed each time. The fabrication process of each individual first silicon germanium layer 135 may be similar with the above described processes for forming the first silicon germanium layer 135 and/or the second silicon germanium layer 145, the details are omitted. Further, in certain other embodiments, the second silicon germanium layer 145 may be formed first, followed by forming the first silicon germanium layer 135.

After forming the second silicon germanium layer 145, the second hard mask layer may be removed. The hard mask layer may be removed by any appropriate process, such as a dry etching process including a plasma etching process or an ion beam etching process, or a wet etching process, etc. In one embodiment, the hard mask layer is made of silicon oxide, and the silicon oxide hard mask layer may be removed by a wet etching process. An etching liquid of the wet etching process may be a diluted hydrogen fluoride, or any other appropriate etching solution.

Referring to FIG. 10, after forming the first silicon germanium layer 135 and the second silicon germanium layer 145, an ion implantation process may be performed to form P-type doping ion in the first silicon germanium layer 135 and the second silicon germanium layer 145 to form source regions and/or drain regions. The P-type ion may include any appropriate type of material, such as boron, gallium, or indium, etc. The source regions and/or the drain regions may be formed by the doped first silicon germanium layer 135 and the doped second silicon germanium layer 145. Adjacent PMOS transistors may share a same source region and/or a drain region. Therefore, a PMOS transistor is formed by one of the gate structures 120 and the first silicon germanium layer 135 and/or the second silicon germanium layer 145 at both sides of each of the gate structures 120.

In certain other embodiments, the first silicon germanium layer 135 and the second silicon germanium layer 145 may be in situ doped with any appropriate P-type ions. The doped first silicon germanium layer 135 and the doped second silicon germanium layer 145 may form the source regions and/or drain regions of PMOS transistors.

In another embodiment, a semiconductor structure may be formed by the above disclosed processes and methods, the corresponding semiconductor structure is illustrated in FIG. 10. The semiconductor structure includes the semiconductor substrate 100 having the surrounding STI structure 110, and a plurality of parallel gate structures 120 on the semiconductor substrate 100 surrounded by the STI structure 110. The semiconductor structure also includes a plurality of the first silicon germanium layers 135 proximity to the STI structure 110 and a plurality of the second silicon germanium layers 145 farther from the STI structure 110. The molar percentage of germanium of the first silicon germanium 135 is greater than the molar percentage of the second silicon germanium layer 145. Each gate structure 120 and first silicon germanium layer 135 and/or the second silicon germanium later 145 at both sides of the gate structure 120 form a PMOS transistor. The detailed structures and intermediate structures are described above with respect to the fabrication methods.

It should be understood that the specification is described by exemplary embodiments, but it is not necessary that each embodiment includes an independent technical solution, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a semiconductor substrate;
   forming a shallow trench isolation structure;
   forming a plurality of parallel gate structures in the semiconductor substrate surrounded by the shallow trench isolation structure;
   forming a plurality of first trenches in the semiconductor substrate on at least one side of the gate structures proximate to the shallow trench isolation structure;
   forming a first silicon germanium layer with a first germanium concentration in each of the first trenches;
   forming a plurality of second trenches in semiconductor substrate on at least one side of the gate structures farther from the shallow trench isolation structure; and
   forming a second silicon germanium layer with a second germanium concentration in each of the second trenches,
   wherein:
   the first germanium concentration is greater than the second germanium concentration.

2. The method according to claim 1, wherein:
   the first germanium concentration is approximately 5%~10% greater than the second germanium concentration.

3. The method according to claim 2, wherein:
   the first concentration is in a range of approximately 30%~45%, and the second concentration is in a range of approximately 20%~35%.

4. The method according to claim 1, wherein forming the first silicon germanium layer further includes:
   forming a first hard mask layer on one surface of the semiconductor substrate, the surface of the shallow trench isolation structure and sidewalls and surfaces of the gate structures;
   forming a plurality of first openings in the first hard mask layer to expose the semiconductor substrate corresponding to the first trenches;
   etching the exposed semiconductor substrate to form the first trenches using the first hard mask with the openings as an etching mask; and
   filling each of the first trenches with silicon germanium material to form the first silicon germanium layer using an epitaxial growth process; and
   forming source regions and drain region.

5. The method according to claim 4, after forming the first silicon germanium layer, further including:
   removing the first hard mask layer made of one or more of silicon oxide, silicon nitride and siliconoxynitride,
   wherein etching the exposed semiconductor substrate to form the first trenches includes:
   etching the exposed semiconductor substrate using a dry etching process followed by a wet etching process.

6. The method according to claim 5, wherein the forming the first trenches further includes:
   forming a plurality of rectangular cross-section trenches in the semiconductor substrate using the dry etching process; and
   etching the rectangular cross-section trenches using the wet etching process to form the first trenches with "Σ" shaped sidewalls at cross-section.

7. The method according to claim 1, wherein forming the second silicon germanium layer further includes:
   forming a second hard mask layer on the surface of the semiconductor substrate, the surface of the shallow trench isolation structure, the first silicon germanium layer and sidewalls and surfaces of the gate structures;
   forming a plurality of second openings in the second hard mask layer to expose the semiconductor substrate corresponding to the second trenches;
   etching the exposed semiconductor substrate to form the second trenches using the second hard mask with the openings as an etching mask; and
   filling each of the second trenches with silicon germanium material to form the second silicon germanium layer using an epitaxial growth process; and
   forming source regions and/or drain regions.

8. The method according to claim 7, after forming the second trenches, further including:
   removing the second hard mask layer made of one or more of silicon oxide, silicon nitride and siliconoxynitride,
   wherein etching the exposed semiconductor substrate to form the second trenches includes:
   etching the exposed semiconductor substrate using a dry etching process followed by a wet etching process.

9. The method according to claim 8, wherein the forming the second trenches further includes:
   forming a plurality of rectangular cross-section trenches in the semiconductor substrate using the dry etching process; and
   etching the rectangular cross-section trenches using the wet etching process to form the second trenches with "Σ" shaped sidewalls at cross-section.

10. The method according to claim 1, wherein forming the shallow trench isolation structure further includes:
    etching the semiconductor substrate to forming a shallow trench using a dry etching method; and
    forming the shallow trench isolation structure using a high aspect ratio process.

11. The method according to claim 1, wherein:
    when the number of the first silicon germanium layers proximate to the shallow trench structure is greater than 2, molar percentages of germanium of different first silicon germanium layers are different, and the closer to the STI structure the first silicon germanium layer is, the higher molar percentage of germanium.

12. The method according claim to 11, wherein:
    the first silicon germanium layers with different molar percentage of germanium are formed independently.

13. The method according to claim 1, wherein:
    a sequence of forming the first silicon germanium layer and the second silicon germanium layer is switchable.

14. A semiconductor structure, comprising:
    a semiconductor substrate;
    a shallow trench isolation structure surrounding active regions of the semiconductor substrate;
    a plurality of parallel gate structures on the semiconductor substrate surrounded by the shallow trench isolation structure;
    a plurality of first silicon germanium layers with a first germanium concentration proximate to the shallow trench isolation structure; and a plurality of second silicon germanium layers with a second germanium concentration farther from the shallow trench isolation structure, wherein:
the first germanium concentration is greater than the second germanium concentration.

15. The semiconductor according to claim 14, wherein:
the first germanium concentration is approximately 5%~10% greater than the second germanium concentration.

16. The semiconductor structure according to claim 14, wherein:
the first germanium concentration is in a range of approximately 30%~45%, and the second germanium concentration is in a range of approximately 20%~35%.

17. The semiconductor according to claim 14, wherein:
molar percentages of germanium of the plurality of first silicon germanium layers are different, and the closer to the shallow trench isolation structure the plurality of first silicon germanium layer is, the higher molar percentage of germanium it has.

18. The semiconductor structure according to claim 14, wherein:
the shallow trench isolation structure generates tensile stress to the semiconductor substrate and channel regions of PMOS transistors subsequently formed on the semiconductor substrate, and the plurality of first silicon germanium layers and the plurality of second germanium layers generate compressive stress to the channel regions of the PMOS transistors.

19. The semiconductor structure according to claim 18, wherein:
a gradually-changed compressive stress of the channel regions of the PMOS transistors generated by the plurality of first silicon germanium layers and the plurality of second silicon germanium layers compensates a gradually-changed tensile stress of the channel regions of the PMOS transistors generated by the shallow trench isolation structure, and an effective stress of the channel regions proximate to the shallow trench isolation structure is equivalent to an effective stress of the channel regions farther from the shallow trench isolation structure.

* * * * *